(12) United States Patent
Staudinger et al.

(10) Patent No.: US 7,598,805 B2
(45) Date of Patent: Oct. 6, 2009

(54) LOAD INSENSITIVE BALANCED POWER AMPLIFIER AND RELATED OPERATING METHOD

(75) Inventors: Joseph Staudinger, Gilbert, AZ (US); George B. Norris, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/013,149

(22) Filed: Jan. 11, 2008

(65) Prior Publication Data

US 2009/0179704 A1    Jul. 16, 2009

(51) Int. Cl.
H03F 3/68 (2006.01)
(52) U.S. Cl. .................... 330/124 R; 330/286; 330/301
(58) Field of Classification Search .................. 330/53, 330/81, 124 R, 284, 286, 295, 301
See application file for complete search history.

(56) References Cited

U.S. PATENT DOCUMENTS

| | | | |
|---|---|---|---|
| 4,656,434 A | 4/1987 | Selin | |
| 6,211,734 B1 * | 4/2001 | Ahn | 330/124 R |
| 6,297,696 B1 | 10/2001 | Abdollahian et al. | |
| 6,614,299 B2 * | 9/2003 | Hirvilampi et al. | 330/124 R |
| 7,138,861 B2 | 11/2006 | Sundstrom et al. | |
| 7,411,450 B2 * | 8/2008 | Albrecht | 330/124 R |

* cited by examiner

Primary Examiner—Khanh V Nguyen
(74) Attorney, Agent, or Firm—Ingrassia, Fisher & Lorenz, P.C.

(57) ABSTRACT

A balanced power amplifier that is insensitive to load line variations is provided. The balanced power amplifier is suitable for use in wireless transmitter applications, such as cellular telephones, mobile computing devices, and portable communication devices. An embodiment of such a balanced power amplifier includes an input coupler, first and second amplifier devices, and a level adjustment component. The input coupler generates a first signal component and a second signal component from an input signal, where the first signal component and the second signal component are out of phase relative to one another. The first amplifier device generates a first output signal that is influenced by the first signal component, and the second amplifier device generates a second output signal that is influenced by the second signal component. The level adjustment component is coupled between the input coupler device and the input of the first amplifier device. The level adjustment component performs signal level tuning on its input signal. The signal level tuning is adaptively performed in response to the impedance characteristics of the load being driven by the balanced power amplifier.

15 Claims, 6 Drawing Sheets

LOAD INSENSITIVE BALANCED POWER AMPLIFIER AND RELATED OPERATING METHOD

TECHNICAL FIELD

Embodiments of the subject matter described herein relate generally to power amplifiers. More particularly, embodiments of the subject matter relate to a balanced power amplifier that is adaptively controlled to be insensitive to variations in load impedance.

BACKGROUND

The prior art includes many different power amplifier designs, including balanced radio frequency (RF) power amplifiers. One well known balanced RF power amplifier design includes two individual amplifiers in parallel. The amplifiers are driven/combined with 90-degree hybrid circuits and/or couplers to form the balanced amplifier. Such balanced power amplifiers are commonly deployed in wireless handset transmitters (e.g., for cellular telephones, mobile computing devices, and the like).

Power amplifiers contained in mobile handset transmitters are exposed to loading effects arising from the antenna and external environment. The proximity of the antenna to various reflective surfaces results in a terminating impedance for the power amplifier that can vary significantly from the desired value (e.g., 50 ohms). The output power capability (to first order) of the amplifier depends on the terminating load impedance (or equivalently load line), and hence performance degradation occurs with antenna loading. Therefore, under certain antenna loading conditions, the power performance of the amplifier becomes compromised leading to a degradation in transmitted signal quality, and a reduction in transmitted power that leads to reduced link margin.

Minimizing impedance variations at the output of a power amplifier results in better overall linearity, which in turn results in increased link margins and, in a cellular telephone context, less dropped calls. Minimizing impedance variations also reduces the amount of interference experienced by other wireless devices. Moreover, minimizing impedance variations results in more efficient operation and reduced power consumption by the wireless device. The prior art includes several balanced power amplifier architectures that address (to some extent) the effects load impedance variations exhibit on the performance of the overall amplifier. Some of these existing solutions utilize tuning elements in a feedback path from the output of the balanced amplifier. Another existing solution employs fixed matching networks in the two amplifier branches.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description may refer to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, the terms "first", "second" and other such numerical terms referring to structures or elements do not imply a sequence or order unless clearly indicated by the context.

For the sake of brevity, conventional techniques related to balanced power amplifiers, variable attenuators, variable gain elements, wireless transmitters, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Figure 1:
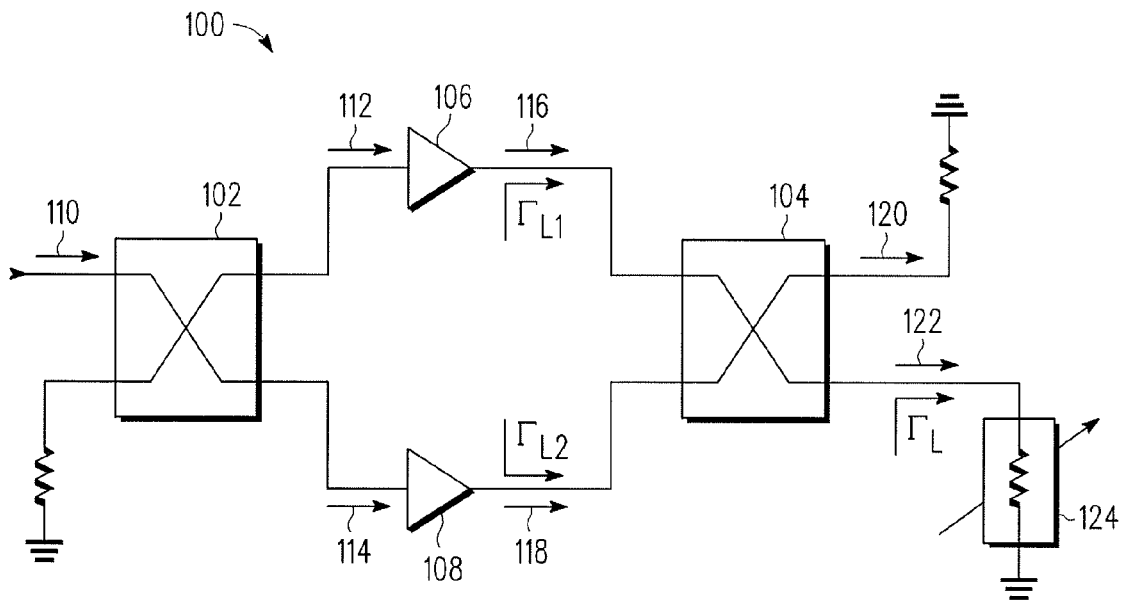
FIG. 1 is a schematic circuit representation of a prior art balanced power amplifier.

FIG. 1 is a schematic circuit representation of a prior art balanced power amplifier 100. The general topology for amplifier 100 includes two 90° couplers 102/104 (one at the input and another one at the output), along with two essentially identical single ended power amplifiers 106/108. The couplers 102/104 are assumed to be of the type that exhibit equal (magnitude) coupling (c) between the direct and coupled ports. Couplers 102/104 operate such that the phase of the forward traveling signal at the direct port is shifted by −90° with respect to the coupled port incident signal. The two identical single ended power amplifiers 106/108 are connected to the couplers 102/104 as illustrated in FIG. 1. Propagation of an input (incident) signal $V_{in}e^{j0}$ though amplifier 100 is depicted in FIG. 1 (this input signal is represented by the arrow labeled 110). Coupler 102 produces one amplifier input signal $c \cdot V_{in}e^{-j0}$ (labeled 112) for amplifier 106, and another amplifier input signal $$c \cdot V_{in}e^{-j\frac{\pi}{2}}$$

(labeled 114) for amplifier 108. Amplifier 106 produces the amplified signal $c \cdot k \cdot V_{in}e^{-j0}$ (labeled 116), and amplifier 108 produces the amplified signal $$c \cdot k \cdot V_{in}e^{-j\frac{\pi}{2}}$$

(labeled 118). Coupler 104 combines these amplified signals and generates an output $c^2 \cdot k \cdot V_{in}\{e^{-j\pi}+e^{-j0}\}$ (labeled 120) and an output $$c^2 \cdot k \cdot V_{in}\{e^{-j\frac{\pi}{2}} + e^{-j\frac{\pi}{2}}\}$$

(labeled 122).

When the impedances of the couplers 102/104, power amplifiers 106/108, and output load 124 are all matched (for example to impedance $Z_o$), the two amplified signals 116/118 combine in the output coupler 104 as intended. Further, under a matched condition all reflected signals have zero magnitude, and thus no power is dissipated in the reflect port of the output coupler 104. In this situation, the two amplifiers 106/108 are essentially terminated by $Z_o$ as well.

A situation of more practical interest considers the case when output load termination impedance $Z_L$ (equivalently represented by the reflection coefficient $\Gamma_L$ in FIG. 1) is different than the coupler characteristic impedance ($Z_o$). Additionally, both of these impedances are different than the output impedances of amplifiers 106/108 ($Z_1$ and $Z_2$, respectively). In this case, reflected voltage signals develop at each port of the output coupler 104, the output ports of each amplifier 106/108, and the load termination network. The reflected signals have the effect of modifying the terminating impedances $Z_1$ and $Z_2$ such that they are unequal to each other, and unequal to $Z_L$ as well.

Figure 2:
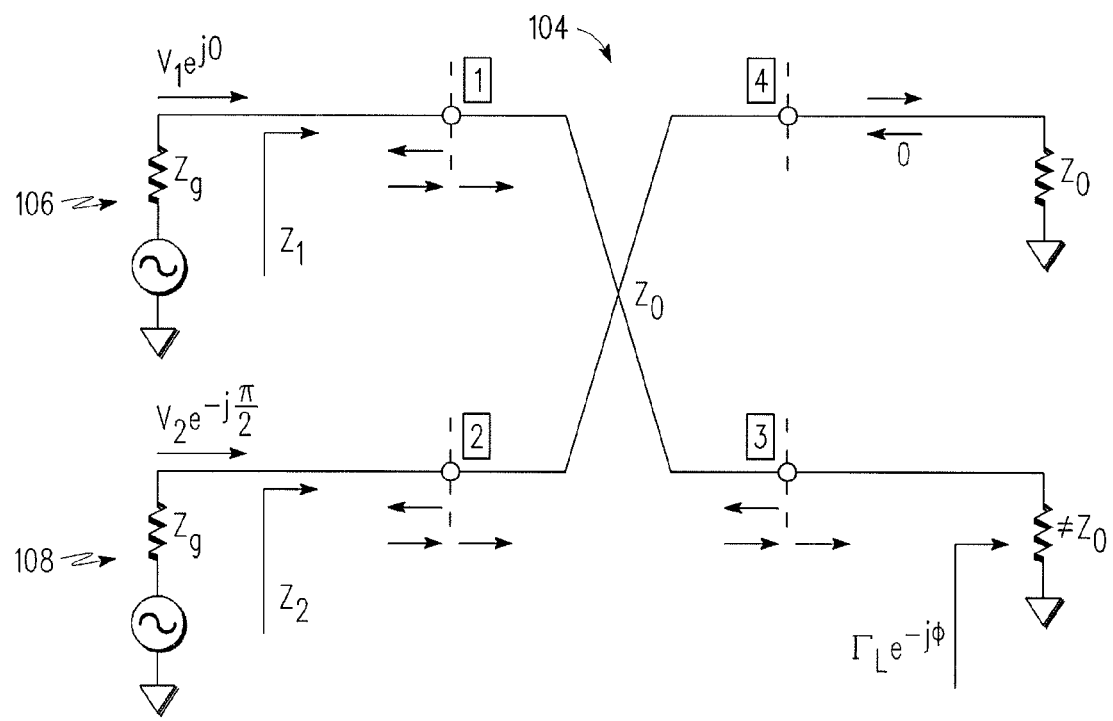
FIG. 2 is a diagram that illustrates an impedance mismatch condition in the balanced power amplifier shown in FIG. 1.

Circuit operation under these conditions can be analyzed by focusing on the output coupler 104 as depicted in FIG. 2, which is a diagram that illustrates an impedance mismatch condition in balanced power amplifier 100. Impedance parameters $Z_1$ and $Z_2$ represent the impedance levels present at the output ports of amplifier 106 and amplifier 108, respectively. The coupler 104 is assumed to exhibit impedance $Z_o$. The arrows in FIG. 2 illustrate both incident and reflected signals arising from non-matched impedances.

Of particular importance are the values of $Z_1$ and $Z_2$, because they relate to the termination impedance (represented by reflection coefficient $\Gamma_L e^{-j\Phi}$). Note that both $Z_1$ and $Z_2$ are primary/fundamental parameters affecting linearity and output power performance of the overall amplifier and hence sensitivity to variations in load terminations.

Circuit analysis leads to the results depicted in FIG. 2, where $$c = 10^{-\frac{C}{20}},$$

$$Z_{oo} = Z_o \frac{1-c}{1+c},$$

and $$Z_{oe} = Z_o \frac{1+c}{1-c}.$$

When $Z_g \neq Z_o$, the impedances looking into ports one and two can be determined as:

$$Z_1 = 2\frac{25Z_L Z_o - 25 \cdot Z_o^2 + Z_o^3 + 2Z_g Z_o^2 - 25Z_g Z_L - 25Z_o Z_g}{Z_g Z_L + Z_o Z_g + 2Z_L Z_o + 50Z_L + 50Z_o - 2Z_o^2}$$

$$Z_2 = -Z_o \frac{3Z_g Z_L + 50Z_L - 50Z_o + 2Z_o^2 - Z_o Z_g}{Z_L Z_o - 3Z_o^2 - Z_g Z_L - Z_o Z_g}$$

The reflection coefficients at ports one and two are given as follows, assuming that $Z_o$=50 ohms and assuming a reference impedance of 50 ohms:

$$\Gamma_1 = \frac{-1}{100} \cdot \frac{Z_g Z_L + 50Z_L - 2500 - 50Z_g}{Z_L + Z_g}$$

$$\Gamma_2 = \frac{1}{2} \cdot \frac{Z_g Z_L + 50Z_L - 2500 - 50Z_g}{Z_L Z_g + 2500}$$

Hence, for constant magnitude $\Gamma_L$ and varying angle, $Z_1$ and $Z_2$ are mapped onto the complex S-plane as a circle with the following attributes:

$$\Gamma_{center} = \frac{-1}{200} \cdot \frac{(Z_g - 50)(Z_g + 50)(Z_L - 50)^2}{(Z_L + Z_g)(Z_g Z_L + 2500)}$$

$$\Gamma_{rad} = \left| \frac{1}{200} \cdot \frac{(Z_g + 50)^2 (Z_L - 50)(Z_L + 50)}{(Z_L + Z_g)(Z_g Z_L + 2500)} \right|$$

Note that if $Z_g$ is complex, then $\Gamma_{center}$ is also complex. If $Z_g$ is complex, and as the magnitude of $\Gamma_L$ increases above zero, the load lines presented to amplifiers 106/108 become increasingly different (unequal) from each other. An analysis of the simulation results shows that when $|\Gamma_L|>0$, both $\Gamma_1$ and $\Gamma_2$ fall onto the S-plane circle defined above by $\Gamma_{center}$ and $\Gamma_{rad}$, but exhibit 180° phase difference from each other. Hence, the load lines presented to amplifiers 106/108 are unequal.

Figure 3:
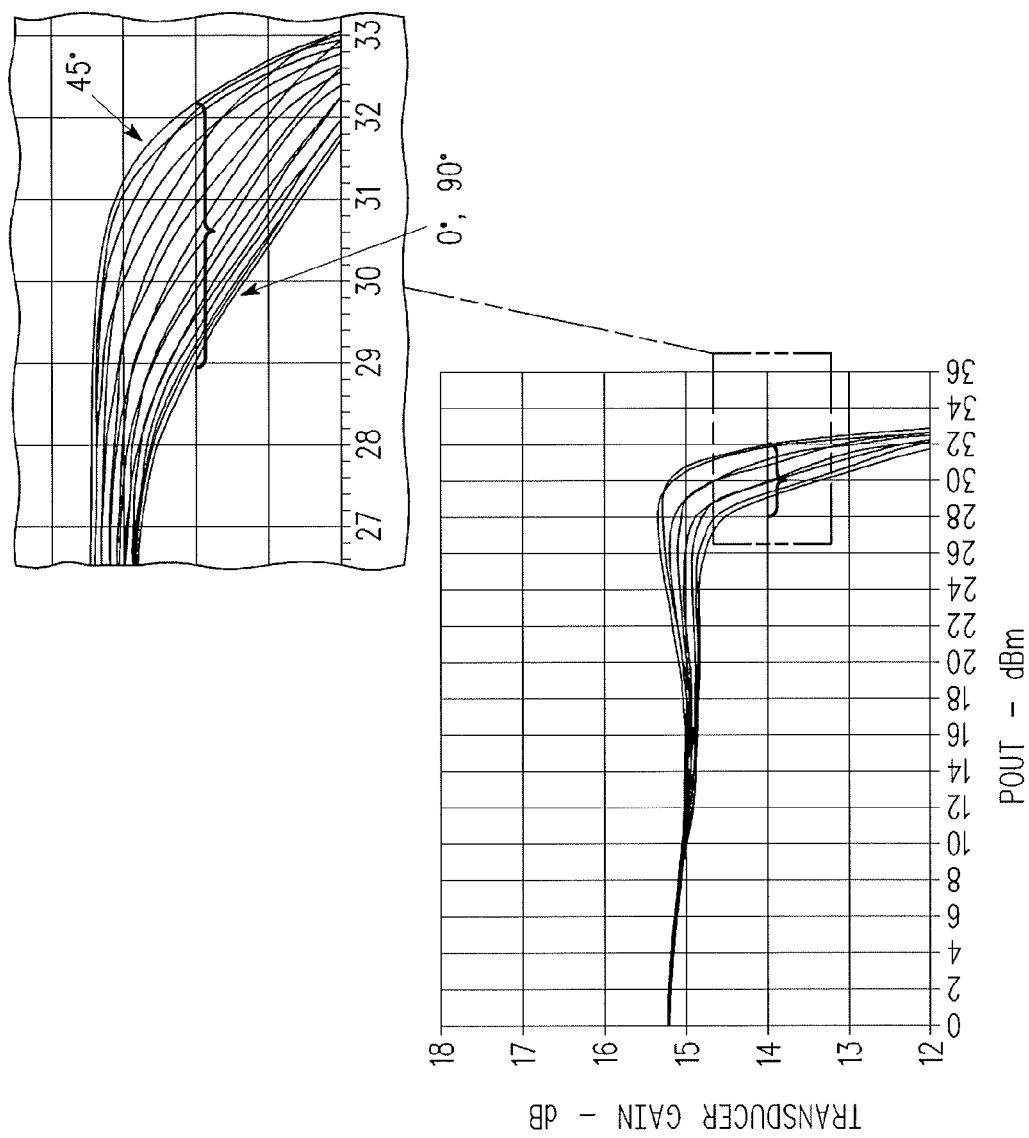
FIG. 3 is a graph of the gain response of a simulated balanced power amplifier of conventional design.

To illustrate this effect, a balanced power amplifier of conventional design (similar to that described above) can be simulated using an appropriate software application. The amplifier load impedance is constrained to a 4:1 VSWR, and the phase angle is varied from 0° to 90°. FIG. 3 is a graph of the overall gain response of the simulated balanced power amplifier. As shown in the expanded detail portion of the graph, each trace represents a different phase angle. Of particular importance are the gain compression characteristics which dictate linearity and fundamental power capability of the amplifier. For this example, the parameter $P_{1\ dB}$ (the output power level corresponding to the point where the gain has dropped one dB from small signal) is used as a metric of saturated power. The brackets in FIG. 3 indicate this $P_{1\ dB}$ point on the graph. For this example, $P_{1\ dB}$ varies from about 29 dBm to about 32 dBm.

Figure 4:
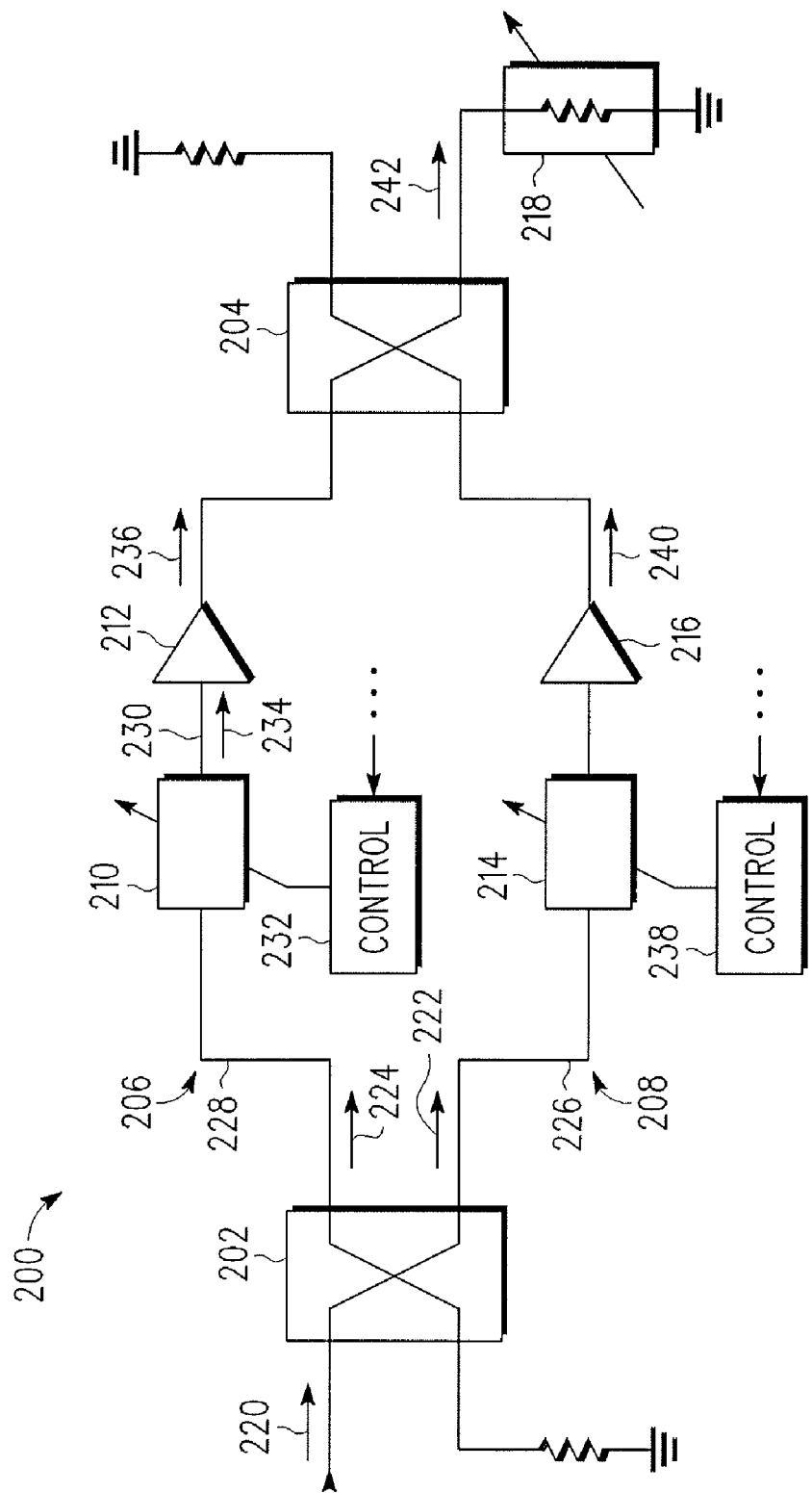
FIG. 4 is a schematic circuit representation of an embodiment of a balanced power amplifier.

The techniques and technologies described herein can be utilized in a balanced power amplifier that in one embodiment has output power performance that is largely insensitive to variations in the terminating impedance presented at the amplifier's output port. FIG. 4 is a schematic circuit representation of an embodiment of a balanced power amplifier 200 having such load insensitivity. Independently controlled RF elements are placed in series between the input 90 degree coupler and each individual RF amplifier. The RF elements may provide attenuation only, amplification only, or both attenuation and amplification (depending upon the needs of the particular application). The attenuation and/or amplification of the RF elements are independently controlled. In certain embodiments, the level/amount of attenuation/amplification is a function of the magnitude and phase angle of the output reflection coefficient. This further has the effect of changing the input RF drive level to each amplifier to be unequal. With properly selected (unequal) drive levels, the load line developed at each individual amplifier can be artificially modified so that it largely negates the deleterious effects which would have resulted from the offending load termination.

Amplifier 200 generally includes, without limitation: an input coupler device 202; an output coupler device 204; a first branch 206 between input coupler device 202 and output coupler device 204; and a second branch 208 between input coupler device 202 and output coupler device 204. First branch 206 includes a level adjustment component 210 and an amplifier device 212, and second branch 208 includes a level adjustment component 214 and an amplifier device 216. Amplifier 200 is suitably configured to drive a load 218, which in this example is a load having a dynamically variable impedance (such as an antenna of a wireless device transmitter). A number of the features, elements, and characteristics of amplifier 200 are similar or identical to that described above in the context of amplifier 100; such common aspects will not be redundantly described here for amplifier 200.

Input coupler device 202 receives an input signal 220 and generates a first signal component 222 and a second signal component 224 from input signal 220, where first signal component 222 and second signal component 224 are out of phase (by 90 degrees) relative to one another. In certain embodiments, input signal 220 has characteristics that are typical for wireless handset applications. For example, input signal 220 may be within a frequency range of 824 MHz to beyond 2 GHz. The input signal typically is a modulated carrier where the modulation contains the information being transmitted (e.g., voice in a cellular handset). For this particular embodiment, input coupler device 202 is a 90 degree coupler that produces in-phase and quadrature (I and Q) signal components. In this regard, first signal component 222 represents the in-phase signal component, and second signal component 224 represents the quadrature signal component. First signal component 222 is provided at a node 226 (e.g., an in-phase signal node), and second signal component 224 is provided at a node 228 (e.g., a quadrature signal node).

Level adjustment component 210 has an input and an output. The input of level adjustment component 210 is coupled to one output port of input coupler device 202, and the output of level adjustment component 210 is coupled to the input of amplifier device 212. For this embodiment, the input of level adjustment component 210 corresponds to node 228, and the output of level adjustment component 210 corresponds to a node 230. Thus, level adjustment component 210 is coupled between input coupler device 202 and amplifier device 212. As described in more detail below, level adjustment component 210 is suitably configured and controlled to perform signal level tuning on its input signal. For this embodiment, level adjustment component 210 is controlled by a control architecture 232 to adjust the level of second signal component 224.

As depicted in FIG. 4, level adjustment component 210 is coupled to input coupler device 202 such that it receives second signal component 224 as its input signal. Level adjustment component 210 is suitably configured to adaptively perform signal level tuning on second signal component 224, resulting in an adjusted amplifier input signal 234. Thus, level adjustment component 210 generates an adjusted signal component (i.e., adjusted amplifier input signal 234) from second signal component 224. Under certain operating conditions, level adjustment component 210 has little or no effect on second signal component 224. In other words, at times adjusted amplifier input signal 234 may be the same (or virtually the same) as second signal component 224.

An embodiment of level adjustment component 210 may include or be realized as a variable attenuation element (or network) and/or a variable gain element (or network). Thus, the amount of attenuation or the amount of gain provided by level adjustment component 210 can be dynamically changed according to changing operating conditions (e.g., environmental conditions). For example, control architecture 232 may be suitably configured to control operation of level adjustment component 210 in response to the changing impedance characteristics of load 218. In practice, control architecture 232 can adaptively adjust attenuation/gain of level adjustment component 210 in the desired manner to render amplifier 200 less sensitive to load line fluctuations. In practice, the control signal generated by control architecture 232 may be analog or digital in format.

Amplifier device 212 has an input node that is coupled to the output node of level adjustment component 210, and amplifier device 212 has an output node that is coupled to one input port of the output coupler device 204. For this particular embodiment, amplifier device 212 is connected to level adjustment component 210 such that the input node of amplifier device 212 corresponds to node 230. Amplifier device 212 may be realized as an RF power amplifier device that is suitably configured to generate an output signal 236 in response to adjusted amplifier input signal 234. In practice, output signal 236 will be an amplified representation of adjusted amplifier input signal 234 (amplifier device 212 amplifies the adjusted amplifier input signal 234 to generate output signal 236). Moreover, output signal 236 will be influenced by second signal component 224.

For the branch 208 of amplifier 200, level adjustment component 214 is coupled to input coupler device 202 such that it receives first signal component 222 as its input signal. Level adjustment component 214 is controlled by a control architecture 238. The features, characteristics, and operation of level adjustment component 214, amplifier device 216, and control architecture 238 are similar to that described above with reference to the branch 206 of amplifier 200. Notably, the operation of control architecture 238 is independent of the operation of control architecture 232. In other words, the two level adjustment components 210/214 are configured and controlled to independently tune their respective input signals.

As mentioned above, amplifier device 212 has an output node for output signal 236. Likewise, amplifier device 216 has a respective output node for its output signal 240. Output coupler device 204 has its input ports coupled to the respective output nodes of amplifier devices 212/216. In this embodiment, one input port corresponds to the output node of amplifier device 212 and the other input port corresponds to the output node of amplifier device 216. In other words, amplifier device 212 is connected between level adjustment component 210 and output coupler device 204, and amplifier device 216 is connected between level adjustment component 214 and output coupler device 204.

Output coupler device 204 generates a combined output signal 242 from output signals 236/240. For this example, combined output signal 242 represents the transmit signal that drives load 218. FIG. 4 depicts load 218 as an element having variable impedance, which represents a practical deployment where load 218 is associated with a transmitting antenna of a wireless device.

FIG. 4 shows generalized representations of control architecture 232 and control architecture 238. In certain embodiments, these two items can be implemented as a single architecture that is configured to operate in the manner described herein. In practice, the control architectures 232/238 sense, measure, or detect one or more parameters that are influenced by the varying impedance of the load line. For example, a control architecture 232/238 may include or be realized as a gain detector, sensing circuit, ratio and/or comparator circuitry, and control drivers.

Figure 5:
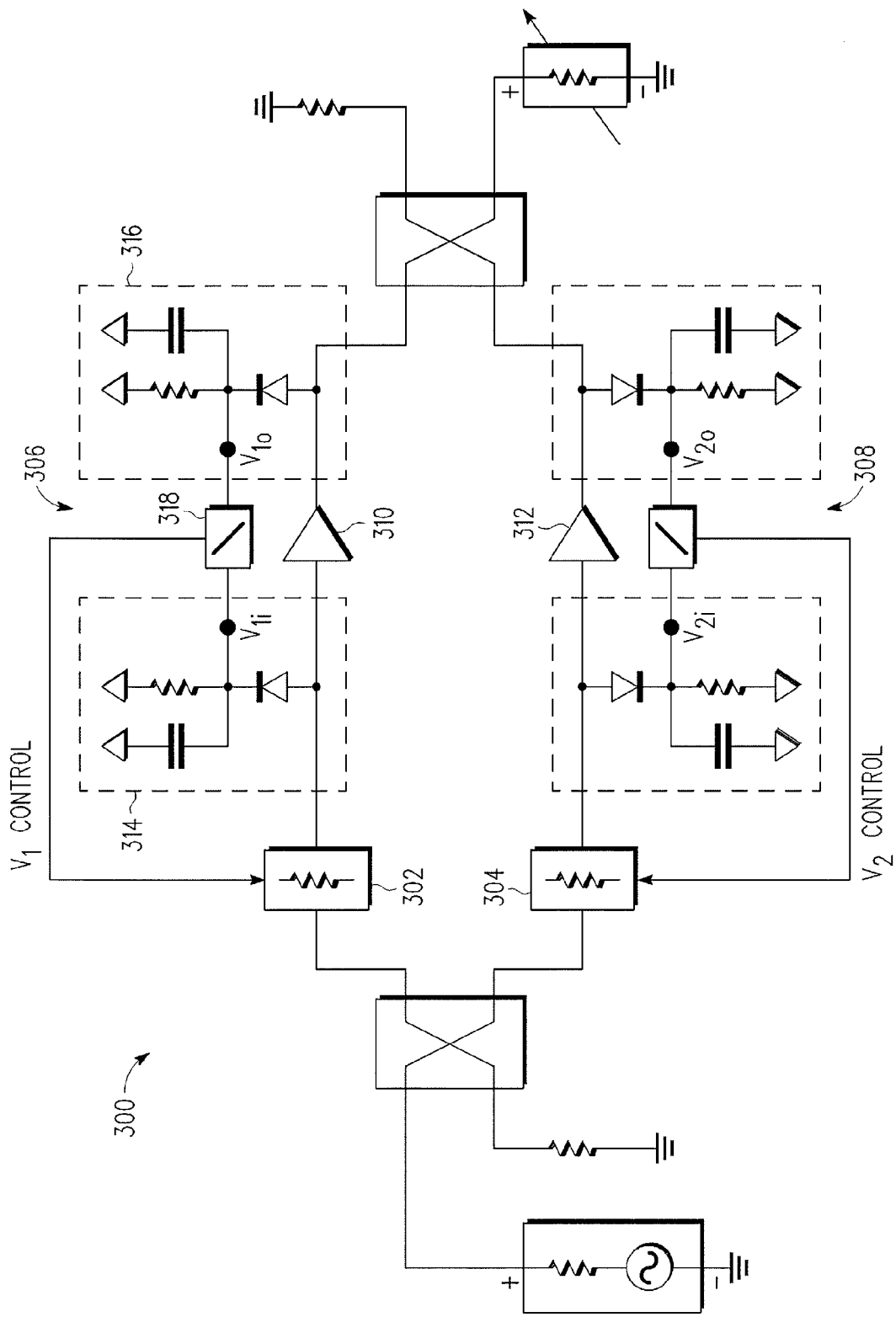
FIG. 5 is a schematic circuit representation of an embodiment of a balanced power amplifier and its related control architecture.

FIG. 5 is a schematic circuit representation of an embodiment of a balanced power amplifier 300 and its related control architectures. Amplifier 300 is similar in many respects to amplifier 200. Accordingly, amplifier 300 will not be described in detail here. The illustrated embodiment of amplifier 300 utilizes variable attenuation elements 302/304 for the level adjusting components. A control architecture 306 for variable attenuation element 302 generates one control signal (labeled $V_{1\_Control}$) that adjusts the attenuation of variable attenuation element 302, while a control architecture 308 for variable attenuation element 304 generates another control signal (labeled $V_{2\_Control}$) that adjusts the attenuation of variable attenuation element 304.

Each control architecture 306/308 is realized as a gain detection circuit for the respective amplifier device. For example, control architecture 306 is designed to detect gain characteristics of amplifier device 310, and control architecture 308 is designed to detect gain characteristics of amplifier device 312. Referring to control architecture 306, the gain detection circuit includes an input detector circuit 314, an output detector circuit 316, and a divider 318. Divider 318 obtains a peak input voltage for amplifier device 310 from input detector circuit 314 and a peak output voltage for amplifier device 310 from output detector circuit 316. Divider 318 generates a ratio of the output voltage to the input voltage, where the ratio is indicative of the gain of amplifier device 310. The $V_{1\_Control}$ signal represents (or is otherwise derived from) the output of divider 318. The $V_{2\_Control}$ signal is similarly generated by control architecture 308. Again, the $V_{1\_Control}$ signal and the $V_{2\_Control}$ signal are generated independently of one another.

In operation, control architecture 306 detects the gain of amplifier device 310 in an ongoing manner, generates the $V_{1\_Control}$ signal, and dynamically tunes the attenuation of variable attenuation element 302. Concurrently, control architecture 308 detects the gain of amplifier device 312 in an ongoing manner, generates the $V_{2\_Control}$ signal, and dynamically tunes the attenuation of variable attenuation element 304. This adaptive tuning is responsive to the impedance characteristics of the load. Ideally, this adaptive tuning scheme minimizes the effects of impedance mismatching caused by the varying load line. This control scheme is effective because the gain of the amplifier devices provides information related to the output impedance matching condition of amplifier 300.

Figure 6:
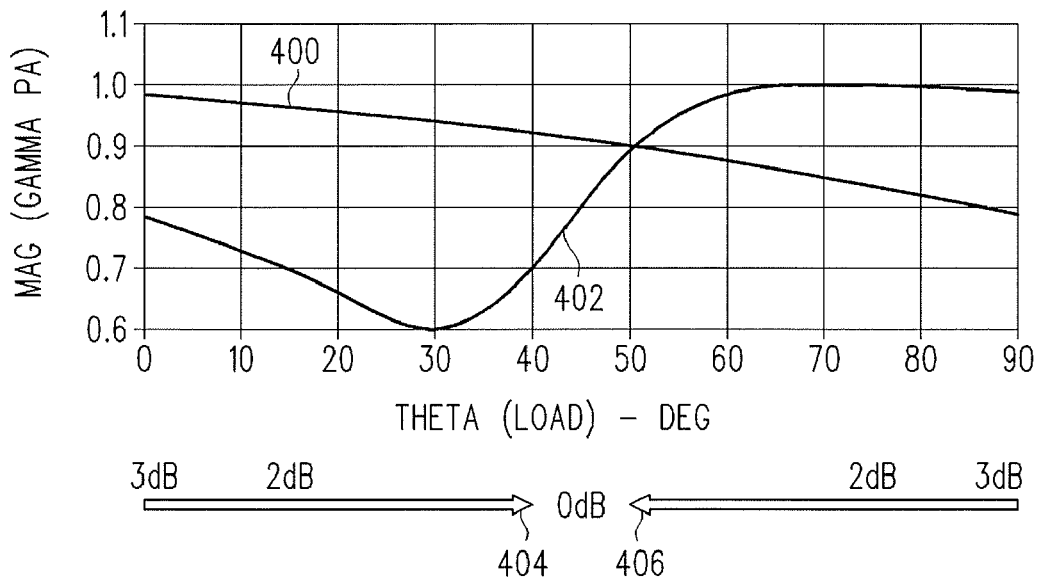
FIG. 6 is a graph that illustrates the reflection coefficient seen by parallel amplifiers under load mismatching.

When amplifier 300 is terminated with a matched load (e.g., 50 ohms) the gains exhibited by amplifier devices 310 and 312 are equal. The control circuitry senses this condition and sets the attenuation in variable attenuation elements 302 and 304 equally (e.g., to zero), so that amplifier devices 310 and 312 are driven by equal magnitude signals, which leads to optimal performance. Under such conditions, the $V_{1\_Control}$ signal and the $V_{2\_Control}$ signal will be at about the same level. Conversely, when amplifier 300 is terminated by a non-matched load, the voltage gains exhibited by amplifier devices 310 and 312 are generally unequal. Further, the gains of amplifier devices 310 and 312 depend on the complex value of the load impedance, or equivalently on both the magnitude and angle of the load reflection coefficient. As shown previously, operation of amplifier 300 under this condition leads to poor performance. Hence, attenuation (and/or gain in certain embodiments) is supplied by variable attenuation elements 302 and 304 to improve performance. The relative amount of attenuation and/or gain needed is illustrated in FIG. 6, in relation to gamma presented to variable attenuation elements 302/304.

Figure 9:
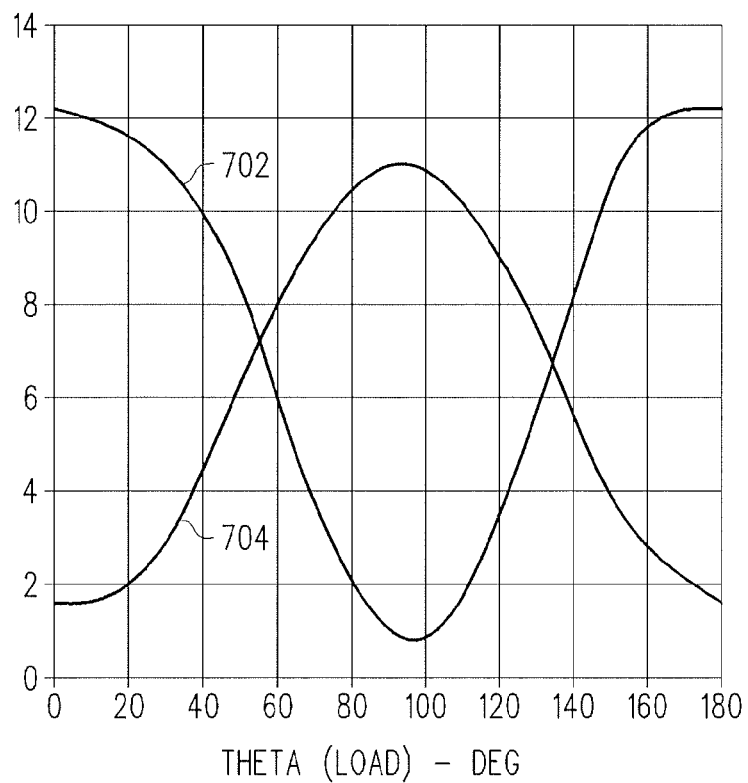
FIG. 9 is a graph that illustrates voltage gain of parallel amplifiers under load mismatching.

Therefore, one possible control method is to measure gamma, and adjust variable attenuation elements 302/304 accordingly. In practice, measuring gamma is somewhat complex requiring a fair amount of circuitry thereby adding cost. In contrast, the control approach utilized by amplifier 300 is based on the gain exhibited by amplifier devices 310/312, which is easy to measure using a combination of input detector circuit 314, output detector circuit 316, and divider 318. FIG. 9 illustrates the gain of amplifier devices 310/312 as a function of reflection coefficient angle. Hence, the reflection coefficient angle can be predicted to some extent based on these gains. As illustrated in FIG. 6, the amount of attenuation is to first order-dependent on the phase angle. Hence, a prediction of the phase angle can be obtained based on the voltage gains, which then provides an indication of the amount of attenuation for variable attenuation elements 302/304.

Note that the method of predicting phase based on the voltage gains is approximate (and may include some ambiguities). For example, in FIG. 9 there is some ambiguity at about 50 degrees and at about 135 degrees. In practice, this ambiguity is not an issue because an inspection of FIG. 6 shows that the optimal attenuation at 50 degrees (and at 135 degrees) is zero attenuation.

An alternative control method providing better performance could be based on a look-up table where predefined values of attenuation/gain for the adjustable elements are stored in a suitably configured storage element (not shown). The predefined values can then be indexed by the voltage gain of amplifier devices 310/312.

Operation of amplifier 300 can be simulated with a suitable software application. The results of such a simulation are depicted in FIGS. 6-9. In this simulation, the variable attenuation elements 302/304 are implemented as passive attenuator elements. A load VSWR of 4:1 is applied to the circuit, and performance is simulated at two worst-case phase angles (0° and 90°).

FIG. 6 is a graph that illustrates (for one embodiment) the magnitude of the reflection coefficient (gamma) presented to the amplifier devices as a function of the phase angle of the combined output signal. FIG. 6 depicts a non-linear simulation of a typical circuit where the attenuation in both variable elements is set to zero. The plot 400 represents the magnitude of the reflection coefficient seen at the output of amplifier device 312, and the plot 402 represents the magnitude of the reflection coefficient seen at the output of amplifier device 310. The arrow 404 indicates the manner in which variable attenuation element 302 is adjusted in response to the phase angle, while the arrow 406 indicates the manner in which variable attenuation element 304 is adjusted in response to the phase angle. For this example, at a phase angle of 0° the attenuation for variable attenuation element 302 is set to 3 dB and the attenuation for variable attenuation element 304 is set to 0 dB. Under these conditions, the $V_{1\_Control}$ signal will be at a voltage that sets variable attenuation element 302 to 3 dB, while the $V_{2\_Control}$ signal will be at a different voltage that sets variable attenuation element 304 to 0 dB (see FIG. 5). At the other end of the horizontal scale, at a phase angle of 90° the attenuation for variable attenuation element 302 is set to 0 dB and the attenuation for variable attenuation element 304 is set to 3 dB. Under these conditions, the $V_{1\_Control}$ signal will be at a voltage that sets variable attenuation element 302 to 0 dB, while the $V_{2\_Control}$ signal will be at a different voltage that sets variable attenuation element 304 to 3 dB (see FIG. 5). Notably, as the phase angle approaches 45° (near the center of the graph) the attenuation of both variable attenuator elements 302/304 decreases. Theoretically, under an ideal 45° phase angle condition both variable attenuator elements 302/304 are set to 0 dB. In practice, the attenuation range of variable attenuation elements 302/304 need not be 0-3 dB, and the actual attenuation range can be selected to suit the needs of the particular application.

Figure 7:
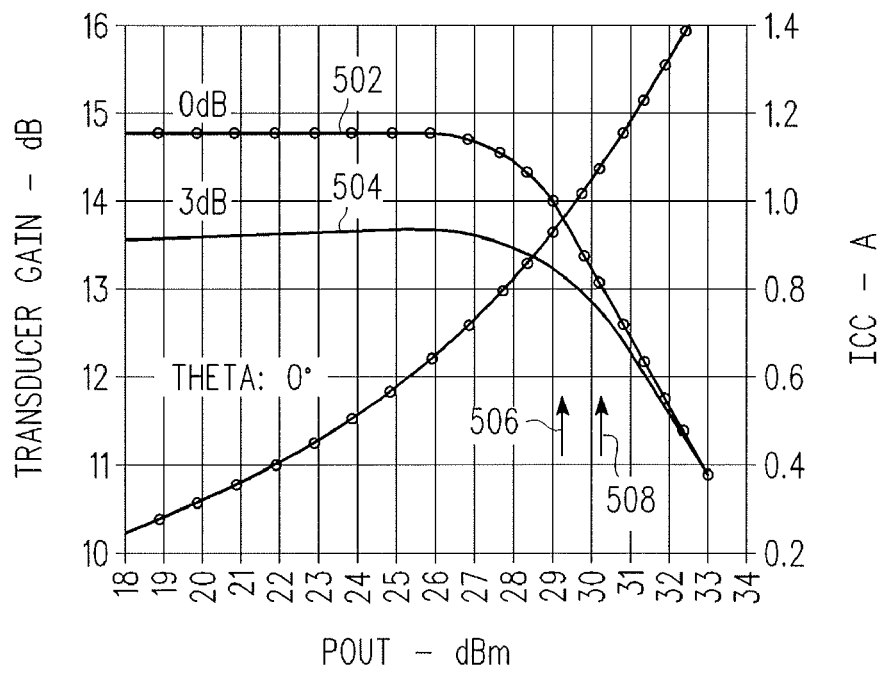
FIG. 7 is a graph that illustrates performance of balanced power amplifiers under a 0° phase angle condition.

FIG. 7 is a graph that illustrates performance of simulated balanced power amplifiers under a 0° phase angle condition. The plot 502 represents the performance of a conventional balanced power amplifier having no variable attenuation elements between the input coupler and the respective amplifier devices. In other words, plot 502 represents a state of amplifier 300 where the attenuation of both variable attenuation elements 302/304 is set to 0 dB. In contrast, the plot 504 represents the performance of balanced power amplifier 300 when variable attenuation element 302 is set to 3 dB and variable attenuation element 304 is set to 0 dB. The arrow 506 indicates the $P_{1\ dB}$ point of the conventional amplifier, and the arrow 508 indicates the $P_{1\ dB}$ point of amplifier 300. Notably, the $P_{1\ dB}$ point of amplifier 300 is more than 1 dB higher (on the output power scale) than the $P_{1\ dB}$ point of the conventional amplifier. This represents a performance improvement over the conventional amplifier.

Figure 8:
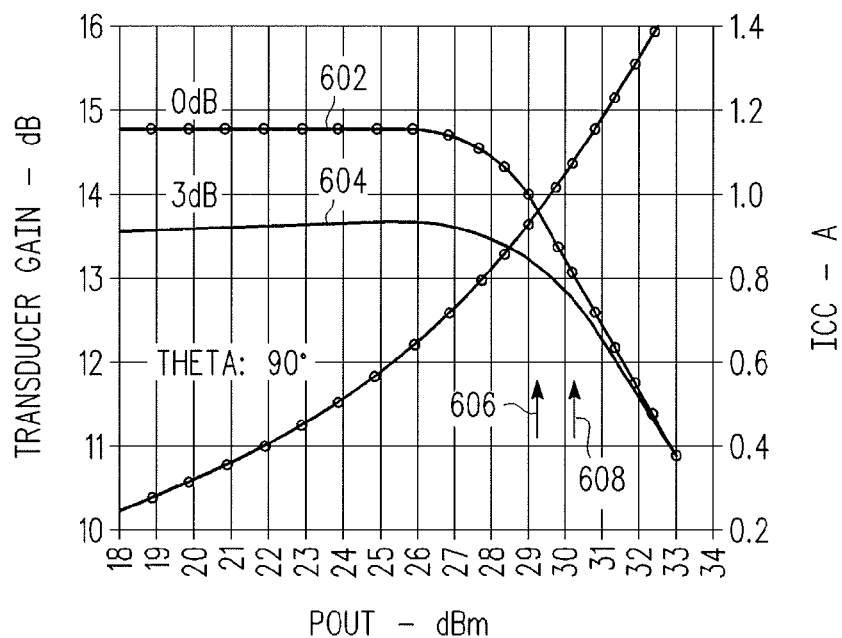
FIG. 8 is a graph that illustrates performance of balanced power amplifiers under a 90° phase angle condition.

FIG. 8 is a graph that illustrates performance of simulated balanced power amplifiers under a 90° phase angle condition. The plot 602 represents the performance of a conventional balanced power amplifier having no variable attenuation elements between the input coupler and the respective amplifier devices. In other words, plot 602 represents a state of amplifier 300 where the attenuation of both variable attenuation elements 302/304 is set to 0 dB. In contrast, the plot 604 represents the performance of balanced power amplifier 300 when variable attenuation element 302 is set to 0 dB and variable attenuation element 304 is set to 3 dB. The arrow 606 indicates the $P_{1\ dB}$ point of the conventional amplifier, and the arrow 608 indicates the $P_{1\ dB}$ point of amplifier 300. The $P_{1\ dB}$ point of amplifier 300 is more than 1 dB higher (on the output power scale) than the $P_{1\ dB}$ point of the conventional amplifier. Again, this represents a performance improvement over the conventional amplifier.

FIG. 9 is a graph that illustrates the relationship between the gain of the two amplifier devices and reflection coefficient phase angle. Referring again to FIG. 5, the plot 702 represents the gain of amplifier device 310, and the plot 704 represents the gain of amplifier device 312. The horizontal scale of this graph represents the phase angle over a range of 0° to 180°. Essentially, the voltage gains, albeit approximate and with some ambiguity, indicates the reflection coefficient angle (and magnitude). The reflection coefficient angle as illustrated in FIG. 9 relates to the amount of attenuation to be supplied. Hence, the voltage gains are a metric for setting the amount of attenuation (as also explained with reference to FIG. 6).

In summary, systems, devices, and methods configured in accordance with exemplary embodiments relate to: a balanced power amplifier; and a method of adaptively adjusting operating characteristics of a balanced power amplifier.

An embodiment of a balanced power amplifier for driving a load comprises: an input coupler device configured to generate a first signal component and a second signal component from an input signal, the first signal component and the second signal component being out of phase relative to one another; a first amplifier device for a first branch of the balanced power amplifier, the first amplifier device comprising a first input node, and the first amplifier device being configured to generate a first output signal that is influenced by the first signal component; a second amplifier device for a second branch of the balanced power amplifier, the second amplifier device being configured to generate a second output signal that is influenced by the second signal component; and a level adjustment component coupled between the input coupler device and the first input node, the level adjustment component being configured to perform signal level tuning on its input signal. In certain embodiments, the level adjustment component is coupled to the input coupler device such that it receives the first signal component as its input signal, the level adjustment component generates an adjusted first signal component from the first signal component, and the first amplifier device amplifies the adjusted first signal component to generate the first output signal. In certain embodiments, the level adjustment component comprises a variable attenuation element. In certain embodiments, the level adjustment component comprises a variable gain element. This balanced power amplifier may further comprise a control architecture coupled to the level adjustment component, the control architecture being configured to control operation of the level adjustment component in response to impedance characteristics of the load. In certain embodiments, the control architecture comprises a gain detection circuit configured to detect gain characteristics of the first amplifier device. In certain embodiments, the first amplifier device comprises a first output node for the first output signal, the second amplifier device comprises a second output node for the second output signal, and the balanced power amplifier further comprises an output coupler device coupled to the first output node and to the second output node, the output coupler device being configured to generate a combined output signal from the first output signal and the second output signal. In certain embodiments, the second amplifier device comprises a second input node, and the balanced power amplifier further comprises a second level adjustment component coupled between the input coupler device and the second input node, the second level adjustment component being configured to perform signal level tuning on its input signal. In certain embodiments, the level adjustment component and the second level adjustment component independently tune their respective input signals. The balanced power amplifier may further comprises a second control architecture coupled to the second level adjustment component, the second control architecture being configured to control operation of the second level adjustment component in response to impedance characteristics of the load.

Another embodiment of a balanced power amplifier for driving a load comprises: an input coupler device configured to produce an in-phase signal component and a quadrature signal component from an input signal, the in-phase signal component being provided at an in-phase signal node, and the quadrature signal component being provided at a quadrature signal node; a first amplifier device for a first branch of the balanced power amplifier, the first amplifier device having a first amplifier input node and a first amplifier output node; a second amplifier device for a second branch of the balanced power amplifier, the second amplifier device having a second amplifier input node and a second amplifier output node; a first level adjustment component coupled between the in-phase signal node and the first amplifier input node; and a second level adjustment component coupled between the quadrature signal node and the second amplifier input node; wherein the first level adjustment component is configured to adaptively perform signal level tuning on the in-phase signal component, resulting in an adjusted first amplifier input signal; and the second level adjustment component is configured to adaptively perform signal level tuning on the quadrature signal component, resulting in an adjusted second amplifier input signal. The balanced power amplifier may further comprise an output coupler device coupled to the first amplifier output node and to the second amplifier output node, the output coupler device being configured to generate a combined output signal. The balanced power amplifier may further comprise a control architecture for the first level adjustment component and the second level adjustment component, the control architecture being configured to adaptively adjust attenuation of the first level adjustment component and/or to adaptively adjust attenuation of the second level adjustment component in accordance with impedance characteristics of the load. The balanced power amplifier may further comprise a control architecture for the first level adjustment component and the second level adjustment component, the control architecture being configured to adaptively adjust gain of the first level adjustment component and/or to adaptively adjust gain of the second level adjustment component in accordance with impedance characteristics of the load. In certain embodiments, the first level adjustment component and the second level adjustment component are configured to independently perform signal level tuning.

An embodiment of a method of adaptively adjusting operating characteristics of a balanced power amplifier is also provided, where the amplifier has an input coupler device, an output coupler device, a first amplifier device coupled between the input coupler device and the output coupler device in a first branch, and a second amplifier device coupled between the input coupler device and the output coupler device in a second branch. The method comprises: adaptively adjusting the level of a first signal component generated by the input coupler device in response to impedance characteristics of a load being driven by the balanced power amplifier, resulting in an adjusted first amplifier input signal; and adaptively adjusting the level of a second signal component generated by the input coupler device in response to the impedance characteristics of the load, resulting in an adjusted second amplifier input signal. The method may further comprise: the first amplifier device amplifying the adjusted first amplifier input signal into a first amplifier output signal; the second amplifier device amplifying the adjusted second amplifier input signal into a second amplifier output signal; and the output coupler device generating a combined output signal from the first amplifier output signal and the second amplifier output signal. In certain embodiments, the balanced power amplifier comprises a first level adjustment component coupled between the input coupler device and the first amplifier device; the balanced power amplifier comprises a second level adjustment component coupled between the input coupler device and the second amplifier device; adaptively adjusting the level of the first signal component comprises dynamically tuning attenuation/gain of the first level adjustment component; and adaptively adjusting the level of the second signal component comprises dynamically tuning attenuation/gain of the second level adjustment component. The method may further comprise: detecting gain of the first amplifier device; and detecting gain of the second amplifier device; wherein dynamically tuning attenuation/gain of the first level adjustment component is influenced by the gain of the first amplifier device; and dynamically tuning attenuation/ gain of the second level adjustment component is influenced by the gain of the second amplifier device. In certain embodiments, adaptively adjusting the level of the first signal component and adaptively adjusting the level of the second signal component are performed independently.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A balanced power amplifier for driving a load, the balanced power amplifier comprising:
   an input coupler device configured to generate a first signal component and a second signal component from an input signal, the first signal component and the second signal component being out of phase by ninety degrees relative to one another;
   a first amplifier device for a first branch of the balanced power amplifier, the first amplifier device comprising a first input node, and the first amplifier device being configured to generate a first output signal that is influenced by the first signal component;

a second amplifier device for a second branch of the balanced power amplifier, the second amplifier device being configured to generate a second output signal that is influenced by the second signal component;

a level adjustment component coupled between the input coupler device and the first input node, the level adjustment component being configured to perform signal level tuning on its input signal; and a control architecture coupled to the level adjustment component, the control architecture being configured to control operation of the level adjustment component in response to impedance characteristics of the load, and the control architecture comprising a gain detection circuit configured to detect gain characteristics of the first amplifier device.

2. The balanced power amplifier of claim 1, wherein:

the level adjustment component is coupled to the input coupler device such that it receives the first signal component as its input signal;

the level adjustment component generates an adjusted first signal component from the first signal component; and the first amplifier device amplifies the adjusted first signal component to generate the first output signal.

3. The balanced power amplifier of claim 1, the level adjustment component comprising a variable attenuation element.

4. The balanced power amplifier of claim 1, the level adjustment component comprising a variable gain element.

5. The balanced power amplifier of claim 1, wherein:

the first amplifier device comprises a first output node for the first output signal;

the second amplifier device comprises a second output node for the second output signal; and the balanced power amplifier further comprises an output coupler device coupled to the first output node and to the second output node, the output coupler device being configured to generate a combined output signal from the first output signal and the second output signal.

6. The balanced power amplifier of claim 1, wherein:

the second amplifier device comprises a second input node; and the balanced power amplifier further comprises a second level adjustment component coupled between the input coupler device and the second input node, the second level adjustment component being configured to perform signal level tuning on its input signal.

7. The balanced power amplifier of claim 6, wherein the level adjustment component and the second level adjustment component independently tune their respective input signals.

8. The balanced power amplifier of claim 6, further comprising a control architecture coupled to the second level adjustment component, the control architecture being configured to control operation of the second level adjustment component in response to impedance characteristics of the load.

9. A balanced power amplifier for driving a load, the balanced power amplifier comprising:

an input coupler device configured to produce an in-phase signal component and a quadrature signal component from an input signal, the in-phase signal component being provided at an in-phase signal node, and the quadrature signal component being provided at a quadrature signal node;

a first amplifier device for a first branch of the balanced power amplifier, the first amplifier device having a first amplifier input node and a first amplifier output node;

a second amplifier device for a second branch of the balanced power amplifier, the second amplifier device having a second amplifier input node and a second amplifier output node;

a first level adjustment component coupled between the in-phase signal node and the first amplifier input node;

a second level adjustment component coupled between the quadrature signal node and the second amplifier input node; and an output coupler device coupled to the first amplifier output node and to the second amplifier output node, the output coupler device being configured to generate a combined output signal; wherein the first level adjustment component is configured to adaptively perform signal level tuning on the in-phase signal component, resulting in an adjusted first amplifier input signal;

the second level adjustment component is configured to adaptively perform signal level tuning on the quadrature signal component, resulting in an adjusted second amplifier input signal; and signal level tuning performed by the first level adjustment component and signal level tuning performed by the second level adjustment component is based on a measured gain of the first amplifier device and the second amplifier device, respectively.

10. The balanced power amplifier of claim 9, further comprising a control architecture for the first level adjustment component and the second level adjustment component, the control architecture being configured to adaptively adjust attenuation of the first level adjustment component and/or to adaptively adjust attenuation of the second level adjustment component in accordance with impedance characteristics of the load.

11. The balanced power amplifier of claim 9, further comprising a control architecture for the first level adjustment component and the second level adjustment component, the control architecture being configured to adaptively adjust gain of the first level adjustment component and/or to adaptively adjust gain of the second level adjustment component in accordance with impedance characteristics of the load.

12. The balanced power amplifier of claim 9, wherein the first level adjustment component and the second level adjustment component are configured to independently perform signal level tuning.

13. A method of adaptively adjusting operating characteristics of a balanced power amplifier having an input coupler device, an output coupler device, a first amplifier device coupled between the input coupler device and the output coupler device in a first branch, and a second amplifier device coupled between the input coupler device and the output coupler device in a second branch, the method comprising:

adaptively adjusting the level of a first signal component generated by the input coupler device in response to impedance characteristics of a load being driven by the balanced power amplifier, resulting in an adjusted first amplifier input signal;

adaptively adjusting the level of a second signal component generated by the input coupler device in response to the impedance characteristics of the load, resulting in an adjusted second amplifier input signal detecting gain of the first amplifier device; and detecting gain of the second amplifier device; wherein the balanced power amplifier comprises a first level adjustment component coupled between the input coupler device and the first amplifier device;

the balanced power amplifier comprises a second level adjustment component coupled between the input coupler device and the second amplifier device;

adaptively adjusting the level of the first signal component comprises dynamically tuning attenuation/gain of the first level adjustment component;

adaptively adjusting the level of the second signal component comprises dynamically tuning attenuation/gain of the second level adjustment component;

dynamically tuning attenuation/gain of the first level adjustment component is influenced by the gain of the first amplifier device; and dynamically tuning attenuation/gain of the second level adjustment component is influenced by the gain of the second amplifier device.

14. The method of claim 13, further comprising:

the first amplifier device amplifying the adjusted first amplifier input signal into a first amplifier output signal;

the second amplifier device amplifying the adjusted second amplifier input signal into a second amplifier output signal; and the output coupler device generating a combined output signal from the first amplifier output signal and the second amplifier output signal.

15. The method of claim 13, wherein adaptively adjusting the level of the first signal component and adaptively adjusting the level of the second signal component are performed independently.

* * * * *